United States Patent
Kwak

(10) Patent No.: US 7,271,412 B2
(45) Date of Patent: Sep. 18, 2007

(54) ACTIVE MATRIX ORGANIC LIGHT EMITTING DEVICE HAVING SERIES THIN FILM TRANSISTOR, AND FABRICATION METHOD THEREFOR

(75) Inventor: Won-Kyu Kwak, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/929,561

(22) Filed: Aug. 31, 2004

(65) Prior Publication Data

US 2005/0045886 A1 Mar. 3, 2005

(30) Foreign Application Priority Data

Sep. 3, 2003 (KR) ............... 10-2003-0061587

(51) Int. Cl.
*H01L 29/04* (2006.01)
*H01L 29/15* (2006.01)

(52) U.S. Cl. .................. 257/59; 257/72; 257/59; 257/351; 257/377; 257/343; 257/E29.273; 257/E29.314

(58) Field of Classification Search .......... 257/59, 257/72, 351, E29.273, E29.314, E29.299, 257/377, 343; 438/157; 349/42–44
See application file for complete search history.

(56) References Cited

U.S. PATENT DOCUMENTS

| 4,942,448 A | * | 7/1990 | Tsukamoto et al. ......... 257/376 |
| 5,587,597 A | * | 12/1996 | Reedy et al. .............. 257/351 |
| 2002/0134983 A1 | * | 9/2002 | Yamazaki ................. 257/72 |

FOREIGN PATENT DOCUMENTS

CN 1101167 4/1995

* cited by examiner

*Primary Examiner*—Jerome Jackson
*Assistant Examiner*—Joseph Nguyen
(74) *Attorney, Agent, or Firm*—H.C. Park & Associates, PLC

(57) ABSTRACT

The series TFT comprises a semiconductor layer including a first body, a second body and a connecting portion serially connecting the first body to the second body. The first body has a first channel region and first source/drain regions positioned at both sides of the first channel region. The second body has a second channel region and second source/drain regions positioned at both sides of the second channel region. And the connecting portion is interposed between the first source/drain region and the second source/drain region to serially connect the first body to the second body and having a conductive type different from that of at least one of the first source/drain region and the second source/drain region. A first gate is positioned to correspond to the first channel region, and a second gate is positioned to correspond to the second channel region. An active matrix OLED can be manufactured using such series TFTs.

18 Claims, 12 Drawing Sheets

ACTIVE MATRIX ORGANIC LIGHT EMITTING DEVICE HAVING SERIES THIN FILM TRANSISTOR, AND FABRICATION METHOD THEREFOR

CROSS-REFERENCE TO RELATED APPLICATION

This application claims the benefit of Korean Patent Application No. 2003-61587, filed on Sep. 3, 2003, which is hereby incorporated by reference for all purposes as if fully set forth herein.

BACKGROUND OF THE INVENTION

1. Field of the Invention

The present invention relates to a thin film transistor, an organic light emitting device (OLED) comprising the same, and a method for fabricating the OLED and, more particularly, to a series thin film transistor, an active matrix OLED comprising the same, and a method for fabricating the active matrix OLED.

2. Discussion of the Related Art

Typically, an OLED is an emissive display of a fluorescent organic compound that has been electrically excited to emit light. Depending upon how the display pixels are driven, OLEDs are classified as either passive or active matrix (AM) OLEDs. In an AM OLED, each pixel is driven by its own pixel driving circuit. The AM OLED uses less power than a passive matrix (PM) OLED, and the AM OLED can be implemented in a larger area and at a higher resolution. The pixel driving circuit includes a switching thin film transistor (TFT), a driving TFT, and a capacitor for its basic configuration. Additional TFTs may be added to the pixel driving circuit to compensate for the threshold voltage, carrier mobility, etc., of the TFTs. In this case, the driving TFTs may be connected to one another by means of a local interconnection line. Such serially interconnected TFTs are referred to as a series TFT.

FIG. 1 shows a cross-sectional view of an OLED having a series TFT in accordance with the prior art.

Referring to FIG. 1, a first patterned semiconductor layer 30 and a second patterned semiconductor layer 35 are positioned on substrate 10. The first patterned semiconductor layer 30 consists of a first channel region 30a and first source/drain regions 30b, 30c, which are formed at both sides of the first channel region 30a. The second patterned semiconductor layer 35 consists of a second channel region 35a and second source/drain regions 35b, 35c, which are formed at both sides of the second channel region 35a. A first gate electrode 50 and a second gate electrode 55 are positioned above the first channel region 30a and the second channel region 35a, respectively. A gate insulating layer 40 is interposed between the channel regions 30a, 35a and the gate electrodes 50, 55. An interlayer 60 is formed to cover the gate electrodes 50, 55, the gate insulating layer 40, and the semiconductor layers 30, 35. In interlayer 60 and gate insulating layer 40, a first contact hole 61 and a second contact hole 63 are formed to expose the first source/drain regions 30b, 30c, respectively, and a third contact hole 65 and a fourth contact hole 67 are formed to expose the second source/drain regions 35b, 35c, respectively. Also formed in the interlayer 60 and the gate insulating layer 40, are the first source/drain electrodes 71, 73 and the second source/drain electrodes 75, 77. Finally, an interconnection line 74 is formed on the interlayer 60. Consequently, the first source/drain electrodes 71, 73 are contacted with the first source/drain regions 30b, 30c, which are exposed in the first and second contact holes 61, 63; the second source/drain electrodes 75, 77 are contacted with the second source/drain regions 35b, 35c, which are exposed in the third and fourth contact holes 65, 67. and The interconnection line 74 serially connects the first source/drain electrode 73 to the second source/drain electrode 75. Thus, the first semiconductor layer 30 and the second semiconductor layer 35 are serially connected to each other by the first source/drain electrode 73, the second source/drain electrode 75, and the interposed interconnection line 74. As a result, the first TFT 51 and the second TFT 56 are serially connected to each other.

In order to implement this series TFT, two contact holes are required, namely the second contact hole 63 for forming the first source/drain electrode 73 and the third contact hole 65 for forming the second source/drain electrode 75. Because these two contact holes are required to be formed on the substrate, this increases the size of the area that the pixel driving circuit occupies, which adversely impacts the ability to increase the aperture ratio. In addition, having two contact holes adversely impacts a design rule that peripheral patterns should maintain regular intervals with respect to the contact holes.

SUMMARY OF THE INVENTION

Accordingly, the present invention is directed to a series TFT, an OLED, and methods of manufacturing an OLED that substantially obviates one or more of the problems due to limitations and disadvantages of the related art.

The present invention provides a series TFT capable of reducing a design rule limitation and increasing an aperture ratio.

The present invention also provides an OLED having the reduced limitation for the design rule and the increased aperture ratio.

Additional features of the invention will be set forth in the description which follows, and in part will be apparent from the description, or may be learned by practice of the invention.

The present invention discloses a series TFT comprising a semiconductor layer including a first body having a first channel region and first source/drain regions positioned at both sides of the first channel region, a second body having a second channel region and second source/drain regions positioned at both sides of the second channel region, and a connecting portion interposed between the first source/drain region and the second source/drain region to serially connect the first body to the second body and having a conductive type different from that of at least one of the first source/drain region and the second source/drain region. It also comprises a first gate electrode positioned to correspond to the first channel region, and a second gate electrode positioned to correspond to the second channel region.

The present invention also provides an AMOLED that comprises a substrate, and a semiconductor layer positioned on the substrate and including a first body having a first channel region and first source/drain regions positioned at both sides of the first channel region, a second body having a second channel region and second source/drain regions positioned at both sides of the second channel region, and a connecting portion interposed between the first source/drain region and the second source/drain region to serially connect the first body to the second body and having a conductive type different from that of at least one of the first source/drain region and the second source/drain region. It also comprises a first gate electrode positioned on the semiconductor layer to be across the first channel region, a second gate electrode positioned on the same layer as the first gate electrode to be across the second channel region, and an interlayer positioned on the first and second gate electrodes to cover the semiconductor layer and the first and second gate electrodes.

The present invention further discloses a method for fabricating such AMOLEDs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
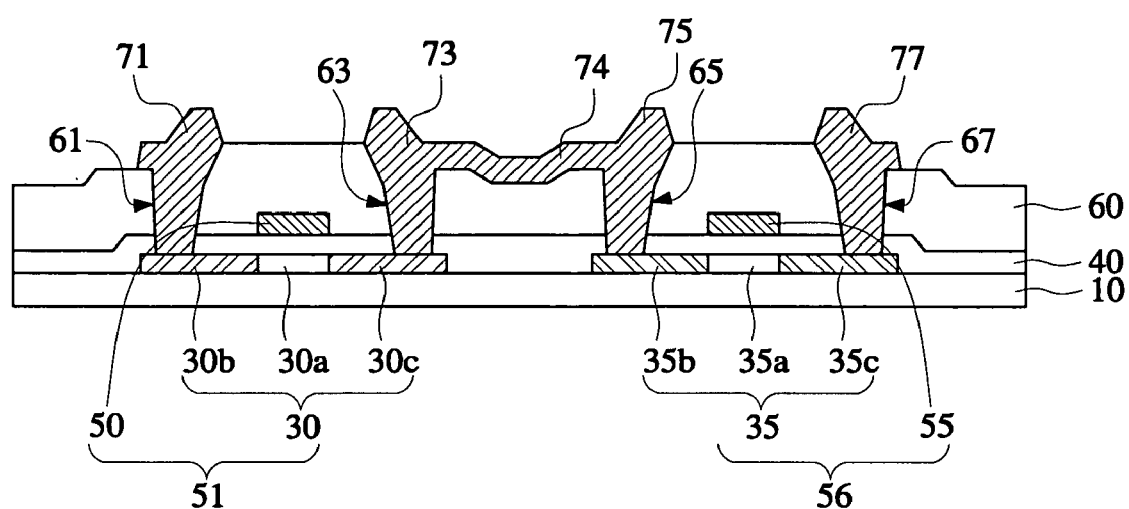
FIG. 1 shows a cross-sectional view of an OLED having a series TFT in accordance with the prior art.

Reference will now be made in detail to embodiments of the present invention, examples of which are illustrated in the accompanying drawings. In the drawings, like numbers refer to like elements throughout the specification.

Figure 2A:
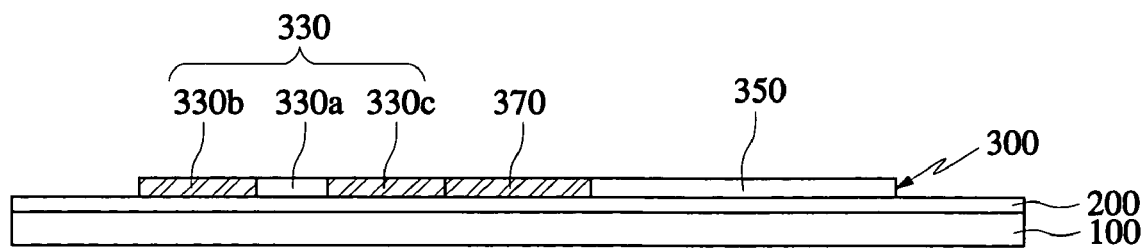
FIGS. 2A, 2B, and 2C show cross-sectional views of an OLED and a method for fabricating an OLED comprising a series TFT in accordance with a first exemplary embodiment of the present invention.
Figure 2B:
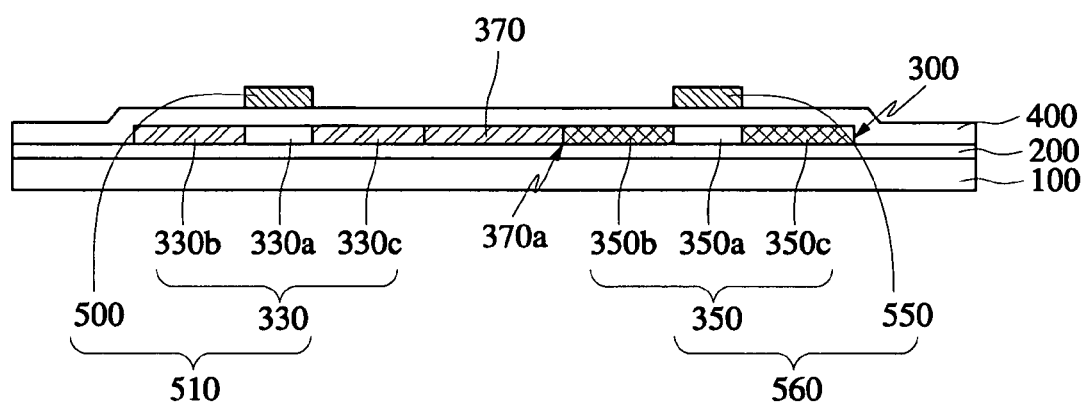
Figure 2C:
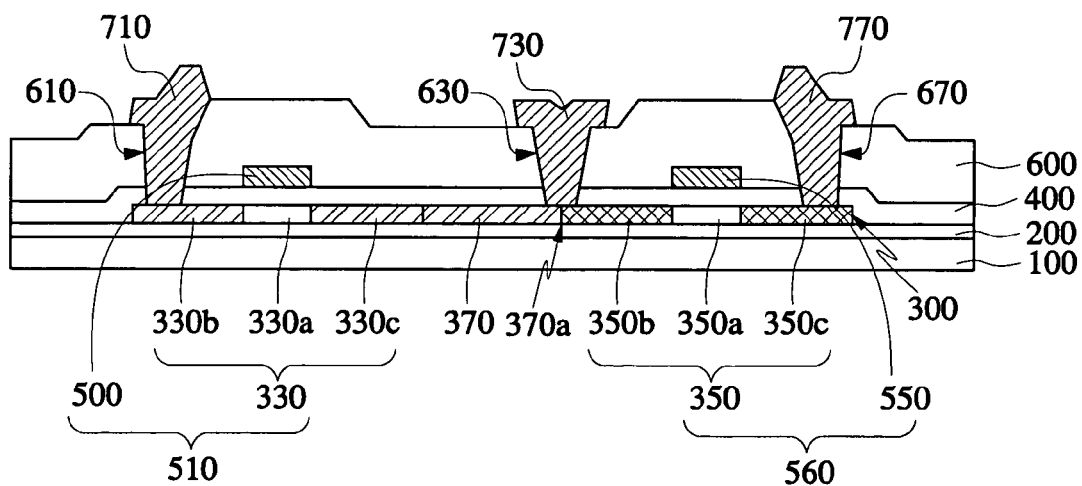

FIGS. 2A, 2B, and 2C show cross-sectional views of an OLED and a method for fabricating an OLED comprising a series TFT in accordance with a first exemplary embodiment of the present invention.

Referring to FIG. 2A, a substrate 100 is provided, and a buffer layer 200 may be formed on the substrate 100. The buffer layer 200 acts to prevent impurities in the substrate 100 from subsequently affecting other layers of the series TFT. The semiconductor layer 300 is then formed on the buffer layer 200. The semiconductor layer may be composed of amorphous silicon or polycrystalline silicon. If composed of polycrystalline silicon, the semiconductor layer is formed through various crystallization methods after the amorphous silicon is formed on the buffer layer 200, which is well known in the art.

The semiconductor layer formed on the buffer layer 200 is then patterned using photoresist, thereby forming a patterned semiconductor layer 300 that has a first body 330, a second body 350, and a connecting portion 370 for serially connecting the first body 330 to the second body 350.

A photoresist pattern (not shown) is then formed to expose the connecting portion 370 and a predetermined region of the first body 330, and a first conductive type impurity is doped using the photoresist pattern as a mask, so that first S/D regions 330b, 330c and the doped connecting portion 370 are formed in the first body 330. As a result, a first channel region 330a is defined between the first S/D regions 330b and 330c. The first conductive type impurity is doped using an n-type dopant, such as $PH_3$, or a p-type dopant, such as $BF_3$, so that the first S/D regions 330b and 330c and the connecting portion 370 are doped to be n-type or p-type.

Referring to FIG. 2B, a gate insulating layer 400 is formed to cover the semiconductor layer 300 where the first S/D regions 330b and 330c and the doped connecting portion 370 are already formed, and a first gate electrode 500 and a second gate electrode 550 are then formed on the gate insulating layer 400 to be across the first channel region 330a and the second body 350, respectively.

A photoresist pattern (not shown) is then formed on the substrate 100 to expose the second body 350, and a second conductive type impurity is doped using a photoresist pattern and the second gate electrode 550 as a mask, thereby forming the second S/D regions 350b and 350c. As a result, a second channel region 350a, between the second S/D regions 350b and 350c, is defined under the second gate electrode 550, and a contact surface 370a, which is the junction between the connecting portion 370 and the second S/D region 350b, is formed. The second conductive type impurity is a dopant having a different conductive type from the first conductive type impurity. Thus, when the first S/D regions 330b and 330c and the connecting portion 370 are doped to be n-type, the second S/D regions 350b and 350c are doped to be p-type, and when the first S/D regions 330b and 330c and the connecting portion 370 are doped to be p-type, the second S/D regions 350b and 350c are doped to be n-type.

As a result, a first TFT 510 and a second TFT 560 are formed. The first TFT 510 comprises the first gate electrode 500 and the first body 330, which further comprises the first channel region 330a and the first S/D regions 330b and 330c. The second TFT 560 comprises the second gate electrode 550 and the second body 350, which further comprises the second channel region 350a and the second S/D regions 350b and 350c. The connecting portion 370, which is interposed between the first S/D region 330c and the second S/D region 350b, connects the first body 330 to the second body 350, thereby serially connecting the first TFT 510 to the second TFT 560. In this exemplary embodiment, the connecting portion 370 is a resistor with a predetermined resistance.

Referring to FIG. 2C, an interlayer 600 is formed to cover the gate insulating layer 400 and the gate electrodes 500 and 550. A first electrode contact hole 610, a connecting contact hole 630 and a second electrode contact hole 670 are then formed within the interlayer 600 and gate insulating layer 400. The first electrode contact hole 610 exposes the first S/D region 330b, the connecting contact hole 630 exposes the contact surface 370a, and the second electrode contact hole 670 exposes the second S/D region 350c.

A conductive layer is then formed to fill the contact holes 610, 630, 670 and patterned using the photoresist as a mask, thereby forming a first S/D electrode 710, a second S/D electrode 770, and a connecting electrode 730. The first S/D electrode 710 contacts the first S/D region 330b exposed by the first electrode contact hole 610, and the second S/D electrode 770 contacts the second S/D region 350c exposed by the second electrode contact hole 670. The connecting electrode 730 contacts the contact surface 370a exposed by the connecting contact hole 630, thereby contacting both the second S/D region 350b and the connecting portion 370.

As explained below, when TFTs 510 and 560 are used to implement this circuit, the connecting contact hole 630 and the connecting electrode 730 are utilized when a reverse bias is applied to the contact surface 370a. Because the second S/D region 350b and the connecting portion 370 are doped to have different conductive types, a pn junction exists at the contact surface 370a. When a forward bias is applied to the pn junction at the contact surface 370a, the built-in potential of the pn junction is very low (about 0.7V), which permits current to easily flow through it. On the other hand, when a reverse bias is applied to the pn junction at the contact surface 370a, the built-in potential is very high, which makes it difficult for current to flow through it. Thus, when the reverse bias is applied to the pn junction at the contact surface 370a, the connecting contact hole 630 and the connecting electrode 730 are utilized to bypass the built-in potential of the pn junction so that the current may easily flow.

As such, per a first exemplary embodiment of the present invention, the first TFT 510 having the first S/D regions 330b and 330c doped with the first conductive type impurities and the second TFT 560 having the second S/D regions 350b and 350c doped with the second conductive type impurities are serially connected by the connecting portion 370, which is a resistor doped with the first conductive type impurity to have a predetermined resistance. This exemplary embodiment, which does not have an interconnection line and requires a single connecting contact hole, provides the capability to reduce the design rule limitation and increase the aperture ratio. Additionally, the resistance distribution of the connecting portion 370 is more uniform than the interconnection line found in the prior art, so that distribution characteristics of the series TFT may be more uniform.

Figure 3A:
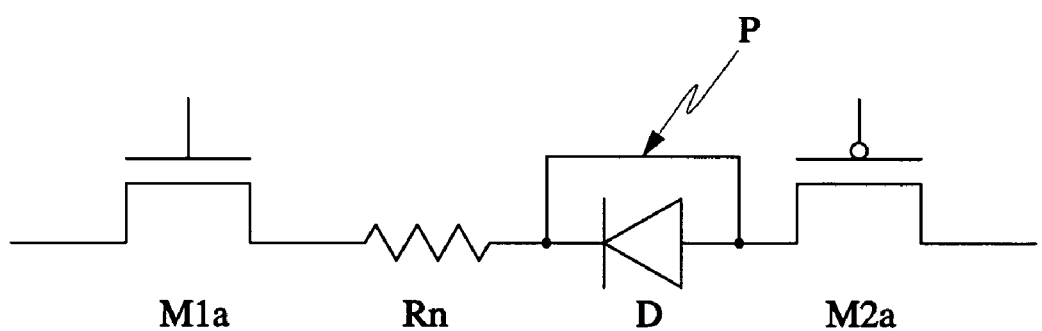
FIGS. 3A and 3B show equivalent circuits for the series TFT in accordance with the first exemplary embodiment.
Figure 3B:
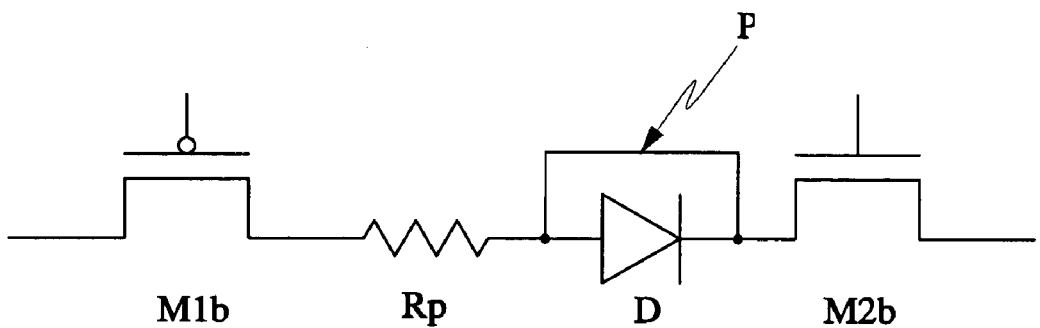

FIGS. 3A and 3B show equivalent circuits for the series TFT in accordance with the first exemplary embodiment.

Referring to FIG. 3A, the first TFT M1a (510 of FIG. 2C) is an n-type TFT having the first S/D regions doped with the n-type impurities (330b, 330c of FIG. 2C), and the second TFT M2a (560 of FIG. 2C) is a p-type TFT having the second S/D regions doped with the p-type impurities (350b, 350c of FIG. 2C). In this exemplary embodiment, the connecting portion, resistor Rn, (370 of FIG. 2C) is doped with n-type impurities (the same conductive type as the first S/D regions 330b, 330c of FIG. 2C), which acts to connect the n-type TFT M1a to the p-type TFT M2a. The pn diode (D) represents the pn junction at the contact surface 370a of FIG. 2C. When implementing the circuit using the series TFT, as the current flows from the n-type TFT M1a to the p-type TFT M2a, it is desirable to form a path P, such as the connecting electrode (730 of FIG. 2C), for the current to easily bypass the pn diode D.

Referring to FIG. 3B, the first TFT M1b (510 of FIG. 2C) is a p-type TFT having the first S/D regions doped with the p-type impurities (330b, 330c of FIG. 2C), and the second TFT M2b (560 of FIG. 2C) is an n-type TFT having the second S/D regions doped with the n-type impurities (350b, 350c of FIG. 2C). In this exemplary embodiment, the connecting portion, resistor Rn, (370 of FIG. 2C) is doped with p-type impurities (the same conductive type as the first S/D regions 330b, 330c of FIG. 2C), which acts to connect the p-type TFT M1b to the n-type TFT M2b. The pn diode (D) represents the pn junction at the contact surface 370a of FIG. 2C. When implementing the circuit using the series TFT, as the current flows from the n-type TFT M2b to the p-type TFT M1b, it is preferable to form a path P, such as the connecting electrode (730 of FIG. 2C), for the current to easily bypass the pn diode D.

Figure 4A:
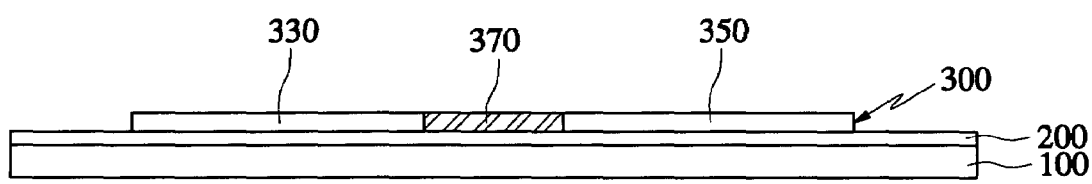
FIGS. 4A, 4B, and 4C show cross-sectional views of an OLED and a method for fabricating an OLED comprising a series TFT in accordance with a second exemplary embodiment of the present invention.
Figure 4B:
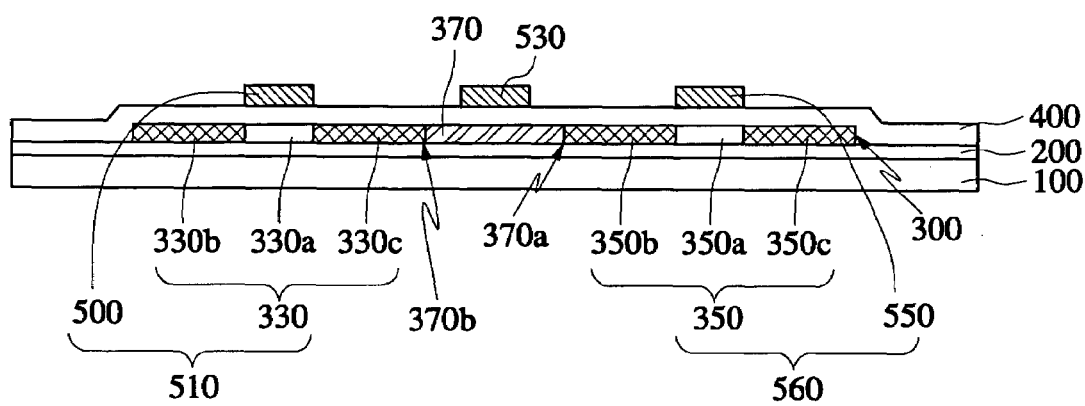
Figure 4C:
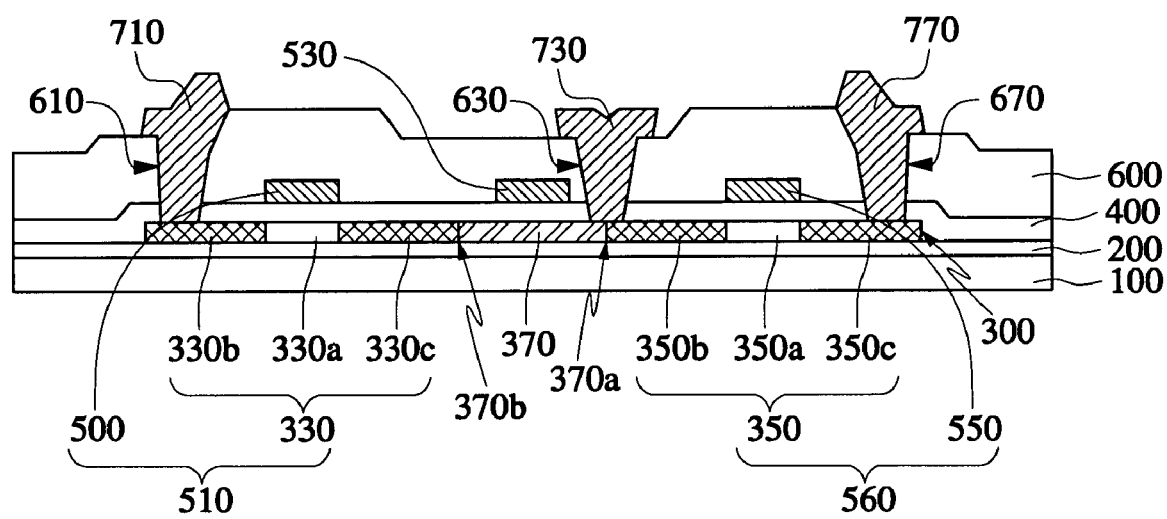

FIGS. 4A, 4B, and 4C show cross-sectional views of an OLED and a method for fabricating an OLED comprising a series TFT in accordance with a second exemplary embodiment of the present invention. Unlike the first exemplary embodiment, this second exemplary embodiment illustrates a series TFT comprising TFTs of same type, which are connected by the connecting portion of a different type.

Referring to FIG. 4A, a substrate 100 is provided, and a buffer layer 200 is preferably formed on the substrate 100. The buffer layer 200 acts to prevent impurities in the substrate 100 from subsequently affecting other layers of the series TFT. The semiconductor layer 300 is then formed on the buffer layer 200. The semiconductor layer may be composed of amorphous silicon or polycrystalline silicon. If composed of polycrystalline silicon, the semiconductor layer is formed through various crystallization methods after the amorphous silicon is formed on the buffer layer 200.

The semiconductor layer formed on the buffer layer 200 is then patterned using photoresist, thereby forming a patterned semiconductor layer 300 that has a first body 330, a second body 350, and a connecting portion 370 for serially connecting the first body 330 to the second body 350.

A photoresist pattern (not shown) is then formed to expose the connecting portion 370, and a first conductive type impurity is doped into the connecting portion 370 using the photoresist pattern as a mask, so that the doped connecting portion 370 is formed on the patterned semiconductor layer 300. The first conductive type impurity is doped using an n-type dopant, such as $PH_3$, or a p-type dopant, such as $BF_3$, so that the connecting portion 370 is doped to be n-type or p-type.

Referring to FIG. 4B, a gate insulating layer 400 is formed to cover the semiconductor layer 300 where the doped connecting portion 370 is already formed, and a first gate electrode 500 and a second gate electrode 550 are formed on the gate insulating layer 400 to be across the first body 330 and the second body 350, respectively. In this exemplary embodiment, a metal wiring 530 is formed between the gate electrodes 500 and 550 to be across the connecting portion 370. The metal wiring 530 acts to apply electrical signals to other elements not shown in the same figure.

A photoresist pattern (not shown) is then formed on the substrate 100 to expose the first body 330 and the second body 350, and a second conductive type impurity is doped using the photoresist pattern and the first and second gate electrodes 500, 550 as a mask, thereby forming the first S/D regions 330b and 330c and the second S/D regions 350b and 350c. As a result, a first channel region 330a, between the first S/D regions 330b and 330c, is defined under the first gate electrode 500, and a second channel region 350a, between the second S/D regions 350b and 350c, is defined under the second gate electrode 550. Additionally, a first contact surface 370a, which is the junction between the connecting portion 370 and the second S/D region 350b, and a second contact surface 370b, which is the junction between the connecting portion 370 and the first S/D region 330c, are formed.

The second conductive type impurity is a dopant having a different conductive type from that of the first conductive type impurity. Thus, when the first S/D regions 330b and 330c and the second S/D regions 350b and 350c are doped to be p-type, the connecting portion 370 is doped to be n-type, and when the first S/D regions 330b and 330c and the second S/D regions 350b and 350c are doped to be n-type, the connecting portion 370 is doped to be p-type. In this exemplary embodiment, the metal wiring 530 does not permit the connecting portion 370 to be doped with the same conductive type as the first or second S/D regions 330b, 330c, 350b, and 350c As a result, a first TFT 510 and a second TFT 560 are formed. The first TFT 510 comprises the first gate electrode 500, and the first body 330, which further comprises the first channel region 330a and the first S/D regions 330b and 330c. The second TFT 560 comprises the second gate electrode 550 and the second body 350, which further comprises the second channel region 350a and the second S/D regions 350b and 350c. The connecting portion 370, which is interposed between the first S/D region 330c and the second S/D region 350b, connects the first body 330 to the second body 350, thereby serially connecting the first TFT 510 to the second TFT 560. In this exemplary embodiment, the connecting portion 370 is a resistor with a predetermined resistance.

Referring to FIG. 4C, an interlayer 600 is formed to cover the gate insulating layer 400, the gate electrodes 500 and 550, and the metal wiring 530. A first electrode contact hole 610, a connecting contact hole 630 and a second electrode contact hole 670 are then formed within the interlayer 600 and gate insulating layer 400. The first electrode contact hole 610 exposes the first S/D region 330b, the connecting contact hole 630 exposes the first contact surface 370a, and the second electrode contact hole 670 exposes the second S/D region 350c.

A conductive layer is then formed to fill the contact holes 610, 630, 670 and patterned using the photoresist as a mask, thereby forming a first S/D electrode 710, a second S/D electrode 770, and a connecting electrode 730. The first S/D electrode 710 contacts the first S/D region 330b exposed by the first electrode contact hole 610, and the second S/D electrode 770 contacts the second S/D region 350c exposed by the second electrode contact hole 670. The connecting electrode 730 contacts the first contact surface 370a exposed by the connecting contact hole 630, thereby contacting both the second S/D region 350b and the connecting portion 370. Alternatively, the connecting contact hole 630 may be formed to expose the second contact surface 370b so that the connecting electrode 730 contacts both the connecting portion 370 and the first S/D region 330c. As mentioned above, the connecting portion 370 is doped with a first conductive type, and its adjacent first S/D region 330c and the second S/D region 350b are doped with a second conductive type, so that the first contact surface 370a and the second contact surface 370b are formed to be pn junctions. When the TFTs 510 and 560 are used to implement the circuit, one of the first and second contact surfaces 370a and 370b will be forward biased, and the other will be reverse biased. Current may easily flow through the forward biased contact surface because of the low built-in potential of the pn junction, however, it may be difficult for the current to flow through the reverse biased contact surface due to the high built-in potential of the pn junction. Therefore, a path, namely the connecting contact hole 630 and the connecting electrode 730, is formed to bypass the built-in potential resulted from the pn junction at the reverse biased contact surface, which results in facilitating the current flow at the reverse biased contact surface.

As such, per a second exemplary embodiment of the present invention, the first TFT 510 having the first S/D regions 330b and 330c doped with the second conductive type impurities, and the second TFT 560 having the second S/D regions 350b and 350c doped with the second conductive type impurities are serially connected by the connecting portion 370, which is a resistor doped with the first conductive type impurity to have a predetermined resistance. This exemplary embodiment, which does not have an interconnection line and requires a single connecting contact hole, provides the capability to reduce the design rule limitation and increase the aperture ratio. Additionally, the resistance distribution of the connecting portion 370 is more uniform than the interconnection line found in the prior art, so that distribution characteristics of the series TFT may be more uniform.

Figure 5A:
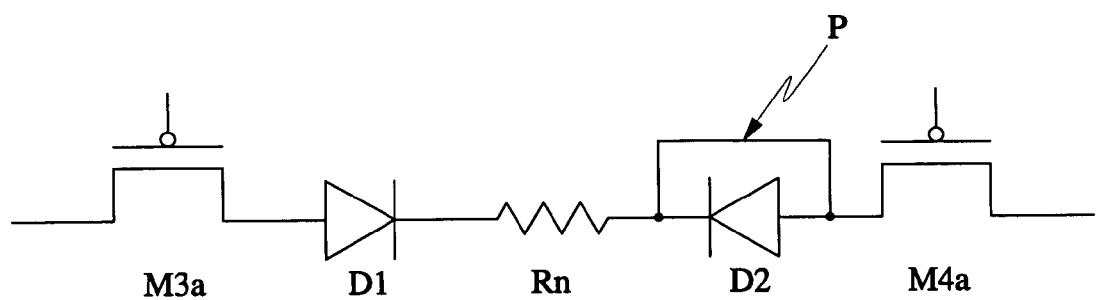
FIGS. 5A and 5B show equivalent circuits for the series TFT in accordance with the second exemplary embodiment.
Figure 5B:
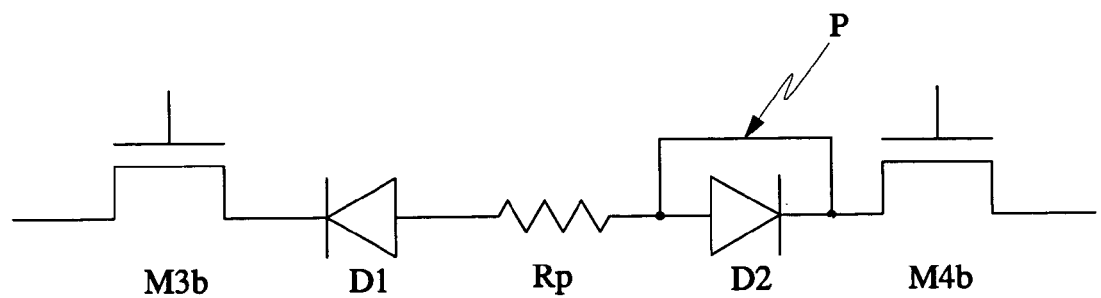

FIGS. 5A and 5B show equivalent circuits for the series TFT in accordance with the second exemplary embodiment.

Referring to FIG. 5A, the first and the second TFTs (510, 560 of FIG. 4C) are a first p-type TFT M3a having a first S/D regions (330b, 330c of FIG. 4C) and a second p-type TFT M4a having a second S/D regions (350b, 350c of FIG. 4C). The first S/D regions and the second S/D regions are doped with p-type impurities. In this exemplary embodiment, a connecting portion (370 of FIG. 4C), which serially connects the p-type TFT M3a to the p-type TFT M4a, is an n-type resistor Rn that has a different conductive type from those of the S/D regions (330b, 330c, 350b, 350c of FIG. 4C). The pn junctions at the contact surfaces 370b and 370a are shown as a first pn diode D1 and a second pn diode D2, respectively. When implementing the circuit using the series TFT, as the current flows from the first p-type TFT M3a to the second p-type TFT M4a, it is preferable to form a path P such as the connecting electrode (730 of FIG. 4C) that bypasses the second pn diode D2 for the current to easily flow.

Referring to FIG. 5B, the first and the second TFTs (510, 560 of FIG. 4C) are a first n-type TFT M3b having the first S/D regions (330b, 330c of FIG. 4C) and a second n-type TFT M4b having the second S/D regions (350b, 350c of FIG. 4C). The first S/D regions and the second S/D regions are doped with n-type impurities. In this exemplary embodiment, a connecting portion (370 of FIG. 4C), which serially connects the n-type TFT M3b to the n-type TFT M4b, is a p-type resistor Rp that has a different conductive type from those of the S/D regions (330b, 330c, 350b, 350c of FIG. 4C). The pn junctions at the contact surfaces 370b and 370a are shown as a first pn diode D1 and a second pn diode D2, respectively. When implementing the circuit using the series TFT, as the current flows from the second n-type TFT M4b to the first n-type TFT M3b, it is preferable to form a path P such as the connecting electrode (730 of FIG. 4C) that bypasses the second pn diode D2 for the current to easily flow.

Hereinafter, in order to further the understanding of the present invention, examples of the concepts contained within the exemplary embodiments of the present invention are presented. However, these examples are only intended to provide further explanation of the invention as claimed. They do not limit the scope of the present invention.

The following first and second examples examine a single TFT that would be used to form a series TFT in accordance with the exemplary embodiments of the present invention. The examples show current transfer characteristics of the TFT where the pn junction is formed at its source or drain region in accordance with the exemplary embodiments of the present invention.

FIRST EXAMPLE

Figure 6A:
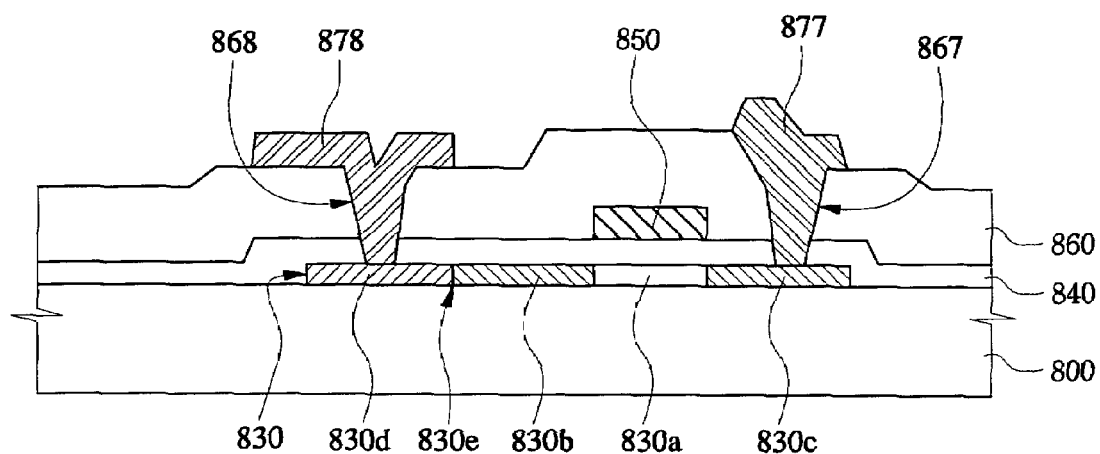
FIGS. 6A, 6B, and 6C show cross-sectional views of TFTs in accordance with first, second and comparative examples, respectively.

Referring to FIG. 6A, an amorphous silicon layer, formed on a substrate 800, was subject to crystallization and patterning to form a semiconductor layer 830. A photoresist pattern was then formed on the semiconductor layer 830 to expose a predetermined region of the semiconductor layer 830, and an n-type dopant as a first conductive type impurity was doped using the photoresist pattern as a mask, so that a first region 830d was formed. The photoresist pattern was then removed and a gate insulating layer 840 was formed on the semiconductor layer 830. A gate electrode material was stacked and patterned to form a gate electrode 850 on the gate insulating layer 840. A photoresist pattern was then formed on the substrate where the gate electrode 850 was already formed to expose the region except the first region 830d, and a p-type dopant as a second conductive type impurity was doped using the photoresist pattern and the gate electrode 850 as a mask, so that second regions 830b and 830c were formed. As a result, a channel region 830a was defined below the gate electrode 850 and between the second regions 830b and 830c. An interlayer 860 was then formed to cover the entire surface of the substrate including the gate electrode 850.

Using a photolithography process, a first S/D contact hole 868, which exposes the first region 830d, and a second S/D contact hole 867, which exposes the second region 830c, were formed within the interlayer 860 and the gate insulating layer 840. A conductive layer was then formed on the substrate where those contact holes were already formed and patterned, thereby forming the first S/D electrode 878, contacted with the first region 830d, and the second S/D electrode 877, contacted with the second region 830c, thereby fabricating the TFT. This TFT has no connecting electrode (730 of FIG. 2C) in the series TFT in accordance with the exemplary embodiment of the present invention described with reference to FIG. 2C. In FIG. 6A, the first region 830d corresponds to the connecting portion of the series TFT (370 of FIG. 2C), and the second regions 830b and 830c correspond to the second S/D regions of the series TFT (350b and 350c of FIG. 2C).

Figure 7A:
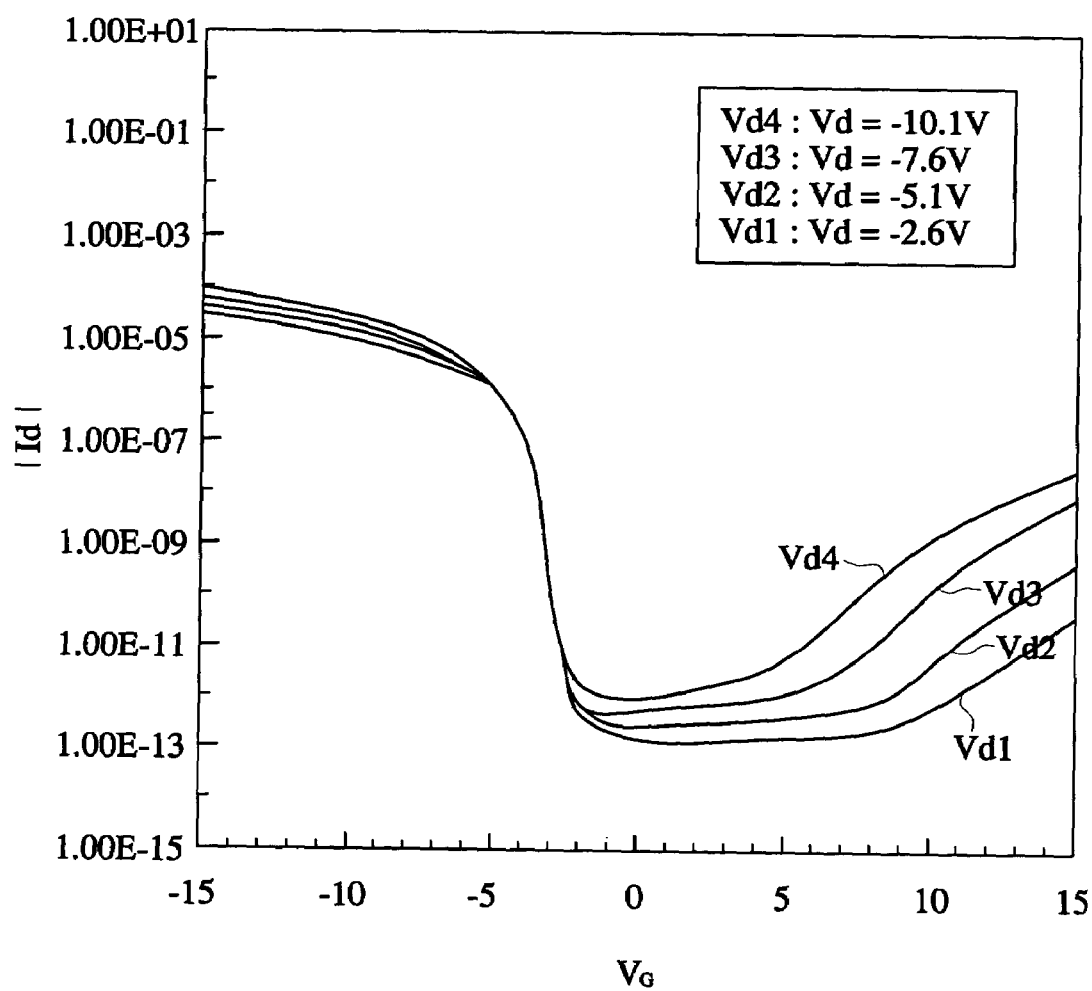
FIGS. 7A and 7B show the current transfer characteristics of the TFT in accordance with the first example based on predetermined conditions.
Figure 7B:
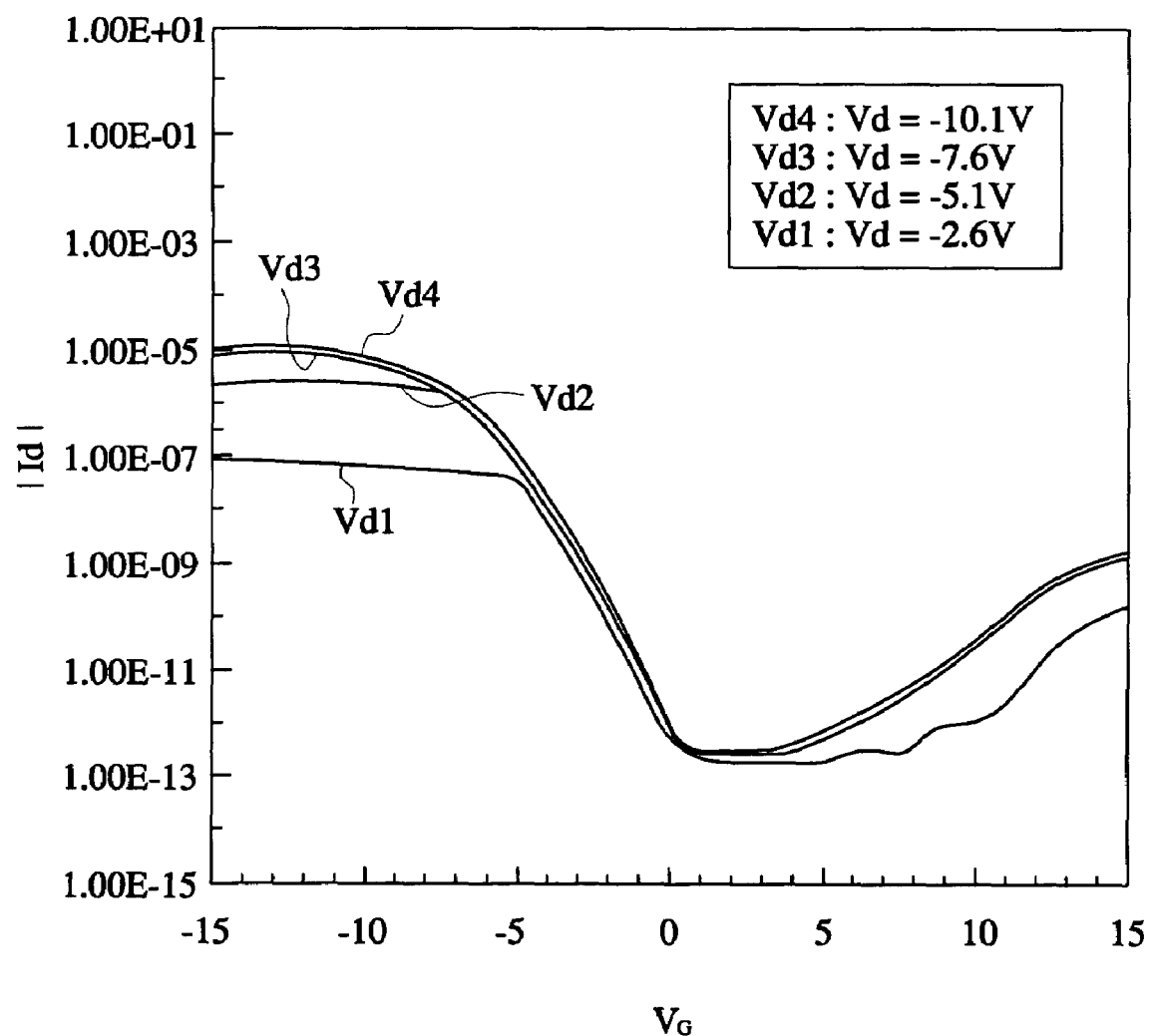

FIG. 7A shows the current transfer characteristics of the TFT, FIG. 6A, after applying a gate voltage to the gate electrode 850 and a voltage Vd to the first S/D electrode 878, and grounding the second S/D electrode 877. Under these conditions, a forward bias was applied at the contact surface 830e between the first region 830d and the second region 830b. On the other hand, FIG. 7B shows the current transfer characteristics of the TFT after applying a gate voltage to the gate electrode 850 and a voltage Vd to the second S/D electrode 877, and grounding the first S/D electrode 878. Under these conditions, a reverse bias was applied at the contact surface 830e between the first region 830d and the second region.

SECOND EXAMPLE

Figure 6B:
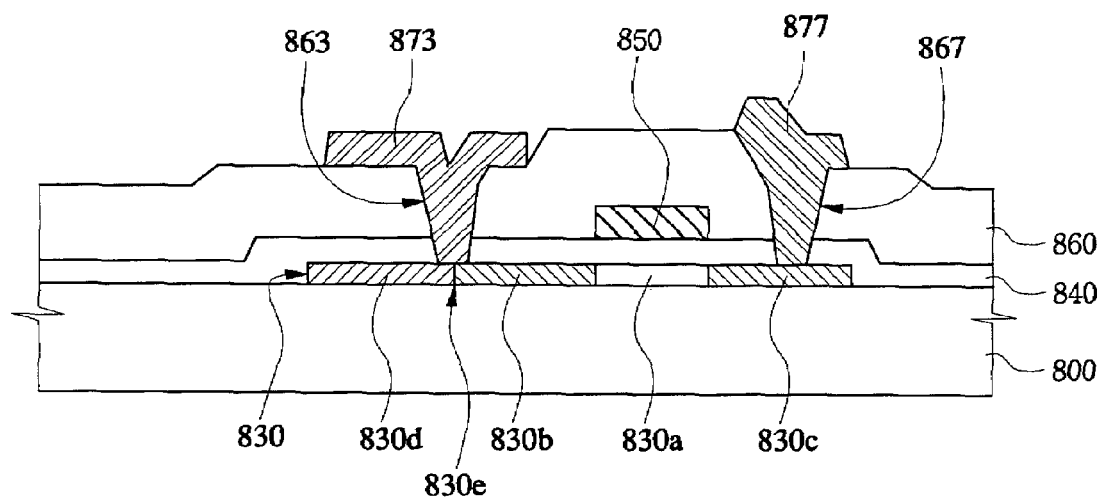

Referring to FIG. 6B, a semiconductor layer 830 having a first region 830d, second regions 830b and 830c and a channel region 830a, a gate insulating layer 840, a gate electrode 850, and an interlayer 860 were formed on a substrate 800 using the same method as the first example.

The first S/D contact hole 863, which exposes a contact surface 830e, and the second S/D contact hole 867, which exposes the second region 830c, were then formed within the interlayer 860 and the gate insulating layer 840. A conductive layer was then stacked on the substrate where the contact holes were already formed and patterned, thereby forming the first S/D electrode 873, contacted with the contact surface 830e, and the second S/D electrode 877, contacted with the second region 830c, thereby fabricating the TFT. This TFT has the connecting electrode (730 of FIG. 2C) in the series TFT in accordance with the exemplary embodiment of the present invention described with reference to FIG. 2C. In FIG. 6B, the first region 830d corresponds to the connecting portion of the series TFT (370 of FIG. 2C), and the second regions 830b and 830c correspond to the second S/D regions of the series TFT (350b and 350c of FIG. 2C), and the first S/D electrode 873 corresponds to the connecting electrode (730 of FIG. 2C).

Figure 7C:
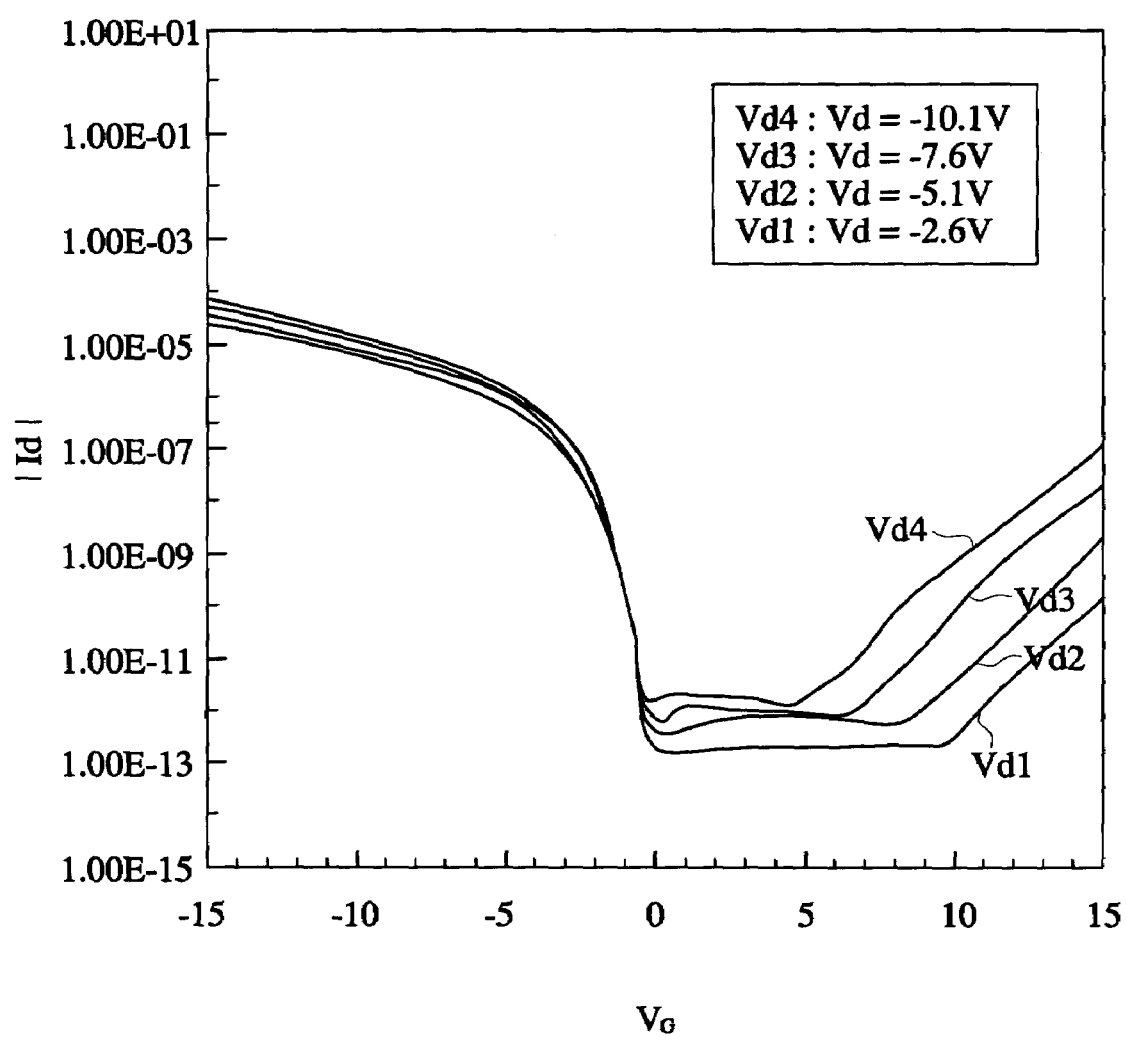
FIGS. 7C and 7D show the current transfer characteristics of the TFTs in accordance with the second and the comparative examples, respectively.

FIG. 7C shows the current transfer characteristics of the TFT after applying a gate voltage to the gate electrode 850 and a voltage Vd to the second S/D electrode 877, and grounding the first S/D electrode 873.

COMPARATIVE EXAMPLE

Figure 6C:
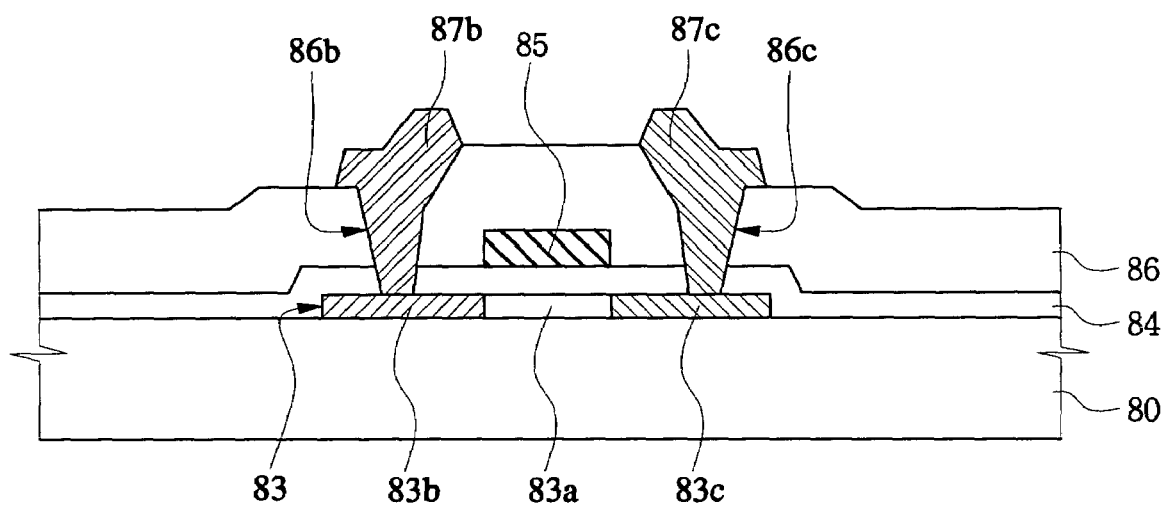

Referring to FIG. 6C, amorphous silicon was formed on a substrate 80 and was subject to crystallization and patterning to thereby form a semiconductor layer 83. A gate insulating layer 84 was then formed on the semiconductor layer 83, and a gate electrode material was stacked on the gate insulating layer 84 and patterned to thereby form a gate electrode 85. A p-type dopant as impurity was doped into the semiconductor layer 83 using the gate electrode 85 as a mask, so that first and second S/D regions 83b and 83c were formed. As a result, a channel region 83a was defined below the gate electrode 85, namely between the first and second S/D regions 83b and 83c. An interlayer 86 was then formed to cover the entire surface of the substrate including the gate electrode 85.

The first S/D contact hole 86b, which exposes the first region 83b, and a second S/D contact hole 86c, which exposes the second region 83c, were then formed in the interlayer 86 and gate insulating layer 84 using a photolithography process. A conductive layer was then stacked and patterned on the substrate where these contact holes were already formed, thereby forming the first S/D electrode 87b, contacted with the second S/D region 83b, and the second S/D electrode 87c, contacted with the second S/D region 83c, thereby fabricating the TFT in accordance with the present example.

Figure 7D:
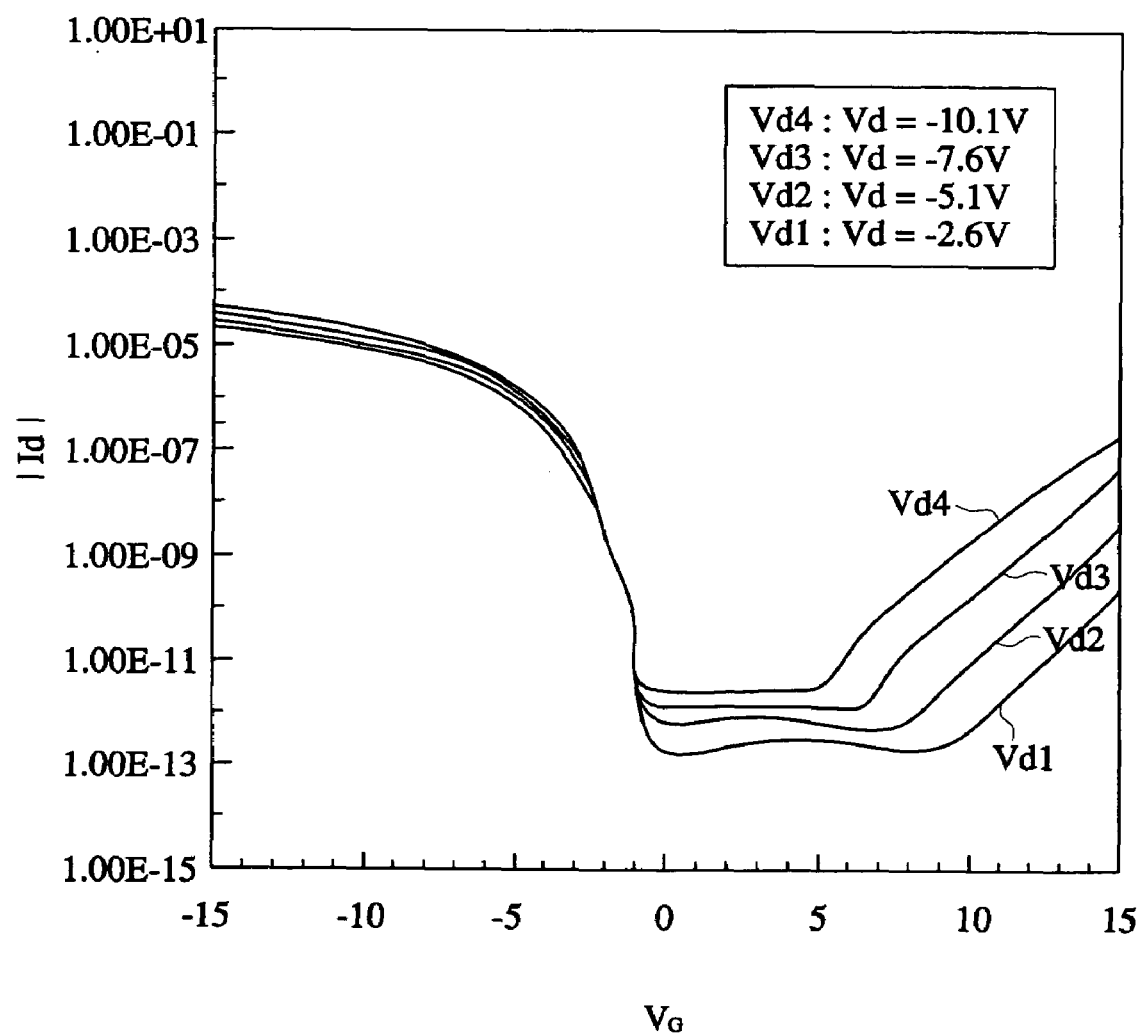

FIG. 7D shows the current transfer characteristics of the TFT after applying a gate voltage to the gate electrode 85 and a voltage Vd to the second S/D electrode 87c, and grounding the first S/D electrode 87b.

FIGS. 7A and 7D show that the current transfer characteristics of the TFTs of the first (FIG. 6A) and comparative (FIG. 6C) examples are not significantly different when a forward bias is applied at the contact surface 830e (FIG. 6A) of the first example TFT. In other words, in the series TFT in accordance with the exemplary embodiment of the present invention with reference to FIG. 2C, the current transfer characteristics do not show any problems when a forward bias is applied at the contact surface 370a. However, FIGS. 7B and 7D showthat when a reverse bias is applied at the contact surface 830e (FIG. 6A) of the first example TFT, a current cut-off phenomena at 5V or less of Vd exists, and a high S-factor as compared to that of the TFT in accordance with the comparative example exists. In other words, in the series TFT in accordance with the exemplary embodiment of the present invention with reference to FIG. 2C, the above-mentioned problem may occur when a reverse bias is applied at the contact surface 370a. However, if this TFT is used at a voltage of 5V or more, there is no current cut-off phenomena, and it is more advantageous to apply the TFT to an element that requires a high S-factor.

FIGS. 7C and 7D show that the current transfer characteristics of the TFTs of the second (FIG. 6B) and comparative (FIG. 6C) examples are almost the same. In other words, in the series TFT in accordance with the exemplary embodiment of the present invention with reference to FIG. 2C, even when a reverse bias is applied at contact surface 370a, general characteristics of the TFT may be obtained when the connecting electrode 730 is formed.

With an OLED fabricated from a series TFT, as mentioned above, when a semiconductor layer doped with impurity to have a predetermined resistance is used as a resistor to connect the TFTs of the series TFT as illustrated in the exemplary embodiments of the present invention, the design rule limitation may be reduced and the aperture ratio may be increased without causing significant problems from any junctions formed between the connecting portion and the S/D region. Additionally, the resistance distribution of the semiconductor layer, used as the resistor, permits more uniform characteristics distribution of the series TFT It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A series thin film transistor (TFT), comprising:
   a semiconductor layer including:
     a first body having a first channel region between first source/drain regions,
     a second body having a second channel region between second source/drain regions, and
     a connecting portion between a first source/drain region of the first source/drain regions and a second source/drain region of the second source/drain regions and having a conductive type different from that of at least one of the first source/drain region and the second source/drain region;
   a first gate electrode positioned to correspond to the first channel region; and
   a second gate electrode positioned to correspond to the second channel region.

2. The series TFT of claim 1, wherein the first source/drain region has a first conductive type, and the second source/drain region has a second conductive type, and the connecting portion has the first conductive type.

3. The series TFT of claim 2, further comprising:
   a connecting electrode positioned on a contact surface between the connecting portion and the second source/drain region adjacent to the connecting portion, and contacting both the connecting portion and the second source/drain region adjacent to the contact surface.

4. The series TFT of claim 1, wherein the first source/drain region has a first conductive type, and the second source/drain region has a second conductive type, and the connecting portion has the second conductive type.

5. The series TFT of claim 4, further comprising:
   a connecting electrode positioned on a contact surface between the connecting portion and the first source/drain region adjacent to the connecting portion, and contacted with both the connecting portion and the first source/drain region adjacent to the contact surface.

6. The series TFT of claim 3, wherein a reverse bias is applied between the connecting portion and the second source/drain region.

7. The series TFT of claim 1, wherein the first source/drain region has a first conductive type, and the second source/drain region has the first conductive type, and the connecting portion has a second conductive type.

8. The series TFT of claim 7, further comprising:
   a connecting electrode positioned on a contact surface between the connecting portion and any one of the first and second source/drain regions adjacent to the connecting portion, and contacted with both the connecting portion and any one of the first and second source/drain regions adjacent to the contact surface.

9. The series TFT of claim 8, wherein a reverse bias is applied between the connecting portion and any one of the first and second source/drain regions.

10. An active matrix organic light emitting device, comprising:
    a substrate;
    a semiconductor layer positioned on the substrate and including:
      a first body having a first channel region between first source/drain regions,
      a second body having a second channel region between second source/drain regions, and
      a connecting portion between a first source/drain region of the first source/drain regions and a second source/drain region of the second source/drain regions to serially connect the first body to the second body and having a conductive type different from that of at least one of the first source/drain region and the second source/drain region;
    a first gate electrode positioned on the semiconductor layer to be across the first channel region;
    a second gate electrode positioned on the same layer as the first gate to be across the second channel region; and
    an interlayer positioned on the first gate electrode and the second gate electrode to cover the semiconductor layer and the first gate electrode and the second gate electrode.

11. The active matrix organic light emitting device of claim 10, wherein the first source/drain region has a first conductive type, and the second source/drain region has a second conductive type, and the connecting portion has the first conductive type.

12. The active matrix organic light emitting device of claim 11, further comprising:
    a contact hole positioned within the interlayer to expose a contact surface between the connecting portion and the second source/drain region adjacent to the connecting portion; and
    a connecting electrode positioned on the interlayer having the contact hole contacting both the connecting portion and the second source/drain region adjacent to the contact surface through the contact hole.

13. The active matrix organic light emitting device of claim 10, wherein the first source/drain region has a first conductive type, and the second source/drain region has a second conductive type, and the connecting portion has the second conductive type.

14. The active matrix organic light emitting device of claim 13, further comprising:
   a contact hole positioned within the interlayer to expose a contact surface between the connecting portion and the first source/drain region adjacent to the connecting portion; and
   a connecting electrode positioned on the interlayer having the contact hole, contacting both the connecting portion and the first source/drain region adjacent to the contact surface through the contact hole.

15. The active matrix organic light emitting device of claim 12, wherein a reverse bias is applied between the connecting portion and the second source/drain region.

16. The active matrix organic light emitting device of claim 10, wherein the first source/drain region has a first conductive type, and the second source/drain region has the first conductive type, and the connecting portion has a second conductive type.

17. The active matrix organic light emitting device of claim 16, further comprising:
   a contact hole positioned within the interlayer to expose a contact surface between the connecting portion and any one of the first and second source/drain regions adjacent to the connecting portion; and
   a connecting electrode positioned on the interlayer having the contact hole, and contacting both the connecting portion and any one of the first and second source/drain regions adjacent to the contact surface through the contact hole.

18. The active matrix organic light emitting device of claim 17, wherein a reverse bias is applied between the connecting portion and any one of the first and second source/drain regions.

* * * * *